United States Patent
Yasuno

(10) Patent No.: US 6,911,594 B2
(45) Date of Patent: Jun. 28, 2005

(54) PHOTOVOLTAIC DEVICE

(75) Inventor: Atsushi Yasuno, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/449,104

(22) Filed: Jun. 2, 2003

(65) Prior Publication Data

US 2003/0227017 A1 Dec. 11, 2003

(30) Foreign Application Priority Data

Jun. 7, 2002 (JP) ........................................ 2002-166429

(51) Int. Cl.⁷ ...................... H01L 31/068; H01L 31/075
(52) U.S. Cl. ...................... 136/258; 136/249; 136/252; 257/49; 257/53
(58) Field of Search ............................ 257/53–54, 249, 257/258, 439, 451, 461, 463, E25.006, E25.007, E25.009, E25.011; 136/249, 258, 243, 252

(56) References Cited

U.S. PATENT DOCUMENTS

| 2,949,498 A | 8/1960 | Jackson .................. 136/89 |
| 4,776,894 A | * 10/1988 | Watanabe et al. ........... 136/249 |
| 4,891,330 A | * 1/1990 | Guha et al. ................. 438/488 |
| 5,514,506 A | 5/1996 | Takai et al. ................ 430/57 |
| 5,676,765 A | * 10/1997 | Saito et al. ................. 136/258 |
| 6,190,932 B1 | 2/2001 | Yoshimi et al. ............... 438/24 |
| 2003/0015234 A1 | 1/2003 | Yasuno ....................... 136/249 |

FOREIGN PATENT DOCUMENTS

| JP | 8-274361 | 10/1996 |
| JP | 9-223807 | 8/1997 |
| JP | 2000-138384 | 5/2000 |

OTHER PUBLICATIONS

S. M. Sze, "Modern Semiconductor Device Physics", John Wiley & Sons, New York (1998), p. 537 (ISBN:0–471–15237–4).*

Guha, et al.; "Enhancement of open circuit voltage in high efficiency amorphous silicon alloy solar cells"; Applied Physics Letters,49, (49), 1986, 218–219.

* cited by examiner

Primary Examiner—Nathan J. Flynn
Assistant Examiner—Johannes Mondt
(74) Attorney, Agent, or Firm—Fitzpatrick, Cella, Harper & Scinto

(57) ABSTRACT

A photovoltaic device including a plurality of unit devices stacked, each unit device comprising a silicon-based non-single-crystal semiconductor material and having a pn or pin structure, in which an oxygen atom concentration and/or a carbon atom concentration has a maximum peak in the vicinity of a p/n interface between the plurality of unit devices.

6 Claims, 6 Drawing Sheets

PHOTOVOLTAIC DEVICE

BACKGROUND OF THE INVENTION

1. Field of the Invention

The present invention relates to a photovoltaic device comprising a silicon-based non-single-crystal semiconductor material.

2. Related Background Art

A photovoltaic device is a semiconductor device for converting optical energy, such as solar light, into electrical energy. As a semiconductor material for such a device, an amorphous material represented by amorphous silicon (a-Si:H) is attracting attention, and is being actively investigated since it is inexpensive, enables a large area formation and a thin film formation, and has a large freedom in the composition, thereby allowing for control of electrical and optical characteristics over a wide range.

In a photovoltaic device comprising the above-mentioned amorphous material, particularly an amorphous solar cell, an improvement in a photoelectric conversion efficiency is an important object.

In order to attain such an object, U.S. Pat. No. 2,949,498 discloses the use of so-called tandem cells, formed by stacking a plurality of solar cells each having a unit device structure. Such tandem cells improve the conversion efficiency by stacking devices of different band gaps and thereby efficiently absorbing different portions of the spectrum of solar light. Tandem cells are so designed that, in comparison with a band gap of a device positioned at a light entrance side (the so-called top layer among the stacked devices), the so-called bottom layer, positioned under such top layer, has a narrower band gap. There is also being investigated a three-layer tandem cell ("triple cell") having a middle layer between the top layer and the bottom layer.

Also in order to facilitate collection of holes having a shorter diffusion distance among electron-hole pairs generated from an incident light, there is often adopted a configuration in which a p-type layer is positioned at a side of a transparent electrode, namely at a light entering side, thereby increasing an overall light collecting efficiency, and a substantially intrinsic semiconductor ("i-type layer") is provided between a p-type layer and an n-type layer.

Also, an improvement in a short-circuit current (Jsc) is achieved by employing a microcrystalline silicon in the p-type layer at the light entrance side, utilizing the properties of the microcrystalline silicon having a high conductivity and a small absorption coefficient in a short wavelength region. Also, the microcrystalline silicon, having a wider band gap than in the amorphous silicon, shows a higher efficiency for impurity doping and provides a larger internal electric field in the photovoltaic device. As a result, there are reported improvements in an open-circuit voltage (Voc) and in the photoelectric conversion efficiency ("Enhancement of open circuit voltage in high efficiency amorphous silicon alloy solar cells", S. Guha, J. Yang, P. Nath and M. Hack: Appl. Phys. Lett., 49 (1986) 218).

However, in such photovoltaic devices, it is difficult to stably control interfacial characteristics of a junction between the p-type layer and the n-type layer, and a change in a junction state or in an amount of impurity causes an increase in a serial resistance and an associated deterioration of I-V (current-voltage) characteristics, thus leading to a fluctuation in the characteristics.

SUMMARY OF THE INVENTION

In consideration of the foregoing, an object of the present invention is to provide a photovoltaic device capable of stabilizing a structure of a p/n interface and improving interfacial characteristics and film adhesion, thereby achieving a high photoelectric conversion efficiency.

The present invention provides a photovoltaic device comprising a plurality of unit devices stacked, each unit device comprising a silicon-based non-single-crystal semiconductor material and having a pn or pin structure, in which an oxygen atom concentration has a maximum peak in a vicinity of a p/n interface between the plurality of unit devices. In such a photovoltaic device, the concentration at the peak of the oxygen atom concentration (peak oxygen concentration) is preferably "$1 \times 10^{18}$ atoms/cm$^3$ or higher and $1 \times 10^{22}$ atoms/cm$^3$ or lower".

Also, the present invention provides a photovoltaic device comprising a plurality of unit devices stacked, each unit device comprising a silicon-based non-single-crystal semiconductor material and having a pn or pin structure, in which a carbon atom concentration has a maximum peak in a vicinity of a p/n interface between the plurality of unit devices. In such a photovoltaic device, the concentration at the peak of the carbon atom concentration (peak carbon concentration) is preferably "$10^{16}$ atoms/cm$^3$ or higher and $10^{20}$ atoms/cm$^3$ or lower".

Also, the present invention provides a photovoltaic device comprising a plurality of unit devices stacked, each unit device comprising a silicon-based non-single-crystal semiconductor material and having a pn or pin structure, in which an oxygen atom concentration and a carbon atom concentration have a maximum peak in a vicinity of a p/n interface between the plurality of unit devices. In such a photovoltaic device, the concentration at the peak of the oxygen atom concentration (peak oxygen concentration) is preferably $1 \times 10^{18}$ atoms/cm$^3$ or higher and $1 \times 10^{22}$ atoms/cm$^3$ or lower, and the concentration at the peak of the carbon atom concentration (peak carbon concentration) is preferably "$10^{16}$ atoms/cm$^3$ or higher and $10^{20}$ atoms/cm$^3$ or lower".

In such photovoltaic devices provided by the present invention, a p-type layer at the aforementioned p/n interface is preferably formed from hydrogenated microcrystalline silicon, and a p-type layer in the aforementioned unit device is preferably positioned at the light entrance side.

In such photovoltaic device, by controlling content of oxygen and/or carbon in the vicinity of the p/n interface, it is possible to stabilize the structure of the aforementioned interface, thereby improving the interfacial characteristics and the film adhesion.

In the present invention, the "p/n interface" in the photovoltaic device formed by stacking a plurality of unit devices each comprising a silicon-based non-single-crystal semiconductor material and having a pn or pin structure means a stacking interface between the stacked unit devices, in other words, between the p-type semiconductor layer of one unit device and the n-type semiconductor layer of another unit device adjacent to the one unit device. In the following, even when not particularly specified, the term "p/n interface" in the present specification means the above-described interface between the unit devices, and it does not mean a p/n interface in an ordinary p/n junction semiconductor device.

DESCRIPTION OF THE PREFERRED EMBODIMENTS

In the following, the present invention will be described in detail with reference to accompanying drawings, but the present invention is not limited by such description.

Figure 1:
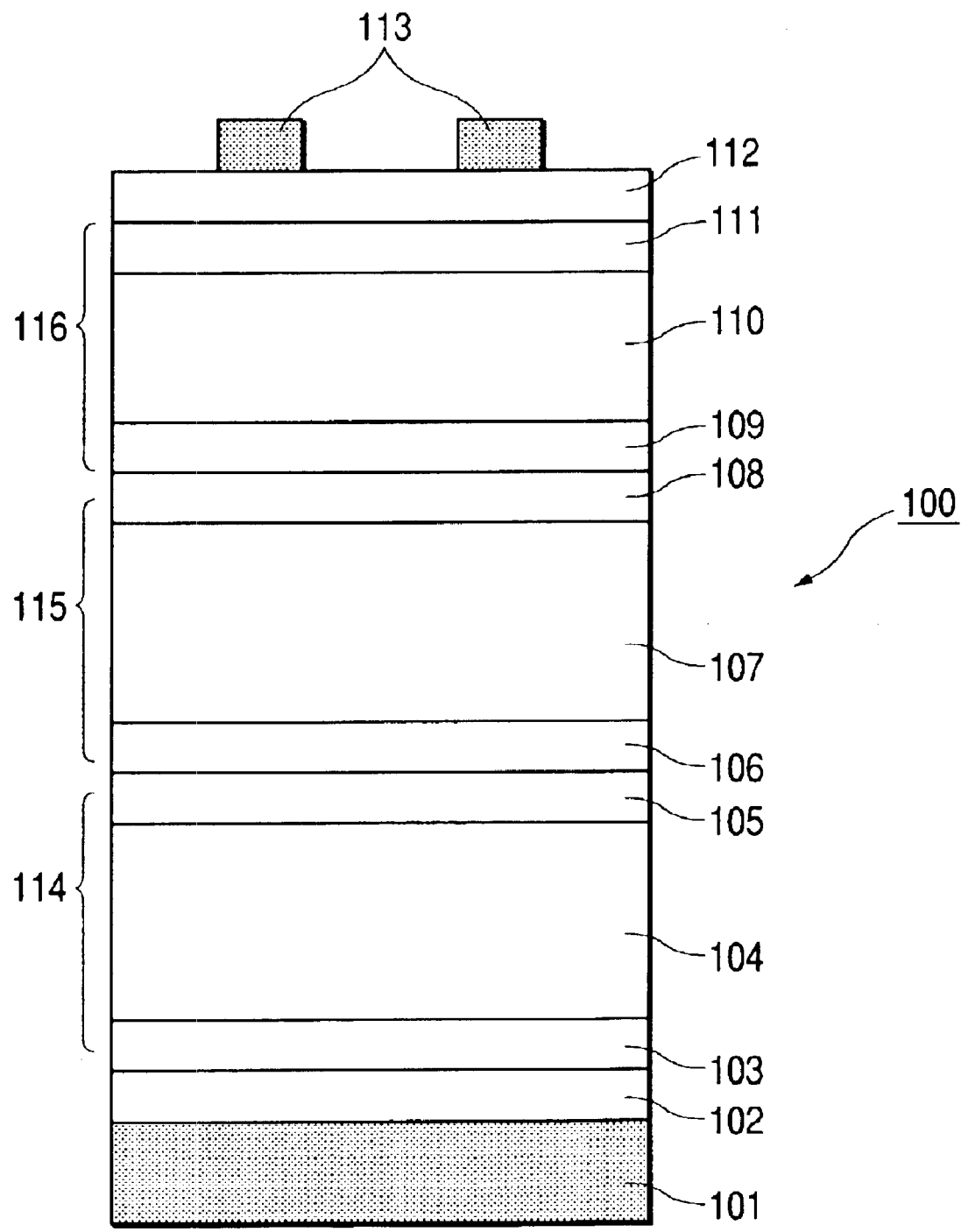
FIG. 1 is a schematic, sectional view showing a configuration of a photovoltaic device of the present invention.

FIG. 1 schematically shows a pin-type amorphous solar cell to which the photovoltaic device of the present invention can be advantageously applied. FIG. 1 shows a solar cell having a structure in which a light enters from the upper side of the solar cell. In FIG. 1, a main body 100 of the solar cell, a bottom layer 114, a middle layer 115, a top layer 116, a substrate 101, a lower electrode 102, n-type semiconductor layers 103, 106, 109, i-type semiconductor layers 104, 107, 110, p-type semiconductor layers 105, 108, 111, an upper electrode 112, and a current-collecting electrode 113 are shown. The bottom layer 114, the middle layer 115 and the top layer 116 respectively constitute the aforementioned unit devices.

(Substrate)

A substrate 101, suitable for deposition of semiconductor layers, may be formed by a single crystalline material or a non-single crystalline material, and may be electrically conductive or insulating. Also, it may be translucent or opaque, but preferably has little deformation or strain and has a desirable level of strength.

Specific examples of the material include a thin plate of a metal such as Fe, Ni, Cr, Al, Mo, Au, Nb, Ta, V, Ti, Pt, or Pb an alloy thereof, such as brass or stainless steel, or a composite thereof. Other examples include a film or a sheet of heat-resistant synthetic resin, such as polyester, polyethylene, polycarbonate, cellulose acetate, polypropylene, polyvinyl chloride, polyvinylidene chloride, polystyrene, polyamide, polyimide or epoxy, or a composite thereof with glass fibers, carbon fibers, boron fibers, metal fibers, or the like. Still other examples include the above metal thin plate or resinous sheet subjected to a surface coating of a thin film of a different metal and/or an insulating thin film, such as of $SiO_2$, $Si_3N_4$, $Al_2O_3$, or AlN by sputtering, evaporation, or plating. Still other examples include glass and ceramics.

In case the substrate is formed by an electrically conductive material such as metal, it may be used directly as a current collecting electrode. In case it is formed by an electrically insulating material such as a synthetic resin, it is desirable to form in advance, on a surface thereof on which a deposited film is to be formed, a single metal or an alloy such as Al, Ag, Pt, Au, Ni, Ti, Mo, W, Fe, V, Cr, Cu, stainless steel, brass, nichrome, $SnO_2$, $In_2O_3$, ZnO or ITO, or a transparent conductive oxide (TCO) by plating, evaporation or sputtering. Naturally, even in case the substrate is electrically conductive such as a metal, a different metal layer or the like may be provided on a side of the substrate on which the deposited film is to be formed, for example for increasing a reflectivity for a light of a longer wavelength on the substrate surface, or for preventing mutual diffusion of elements constituting the substrate and the deposited film.

Also, a surface of the substrate maybe a so-called smooth surface or a surface having small irregularities. In case of a surface with small irregularities, such irregularities may be formed as spherical, conical, or polygonal pyramidal with a maximum height (Rmax) preferably within a range from 50 to 500 nm, whereby the reflection of light on such surface becomes random reflection, with an increase in the optical path length of the light reflected on such surface. A thickness of the substrate is suitably selected so as to obtain a desired photovoltaic device, but is usually made 10 mm or larger in consideration of a mechanical strength of the substrate during manufacture and handling.

In the photovoltaic device of the present invention, suitable electrodes are selected according to the configuration of the device. Such electrodes generally include a lower electrode, an upper electrode (transparent electrode), and a current collecting electrode (the upper electrode indicates an electrode provided at a light entrance side, while the lower electrode indicates an electrode provided opposite to the upper electrode across a semiconductor layer). These electrodes will be explained in detail in the following.

(Lower Electrode)

A lower electrode 102 employed in the present invention is provided between the substrate 101 and an n-type semiconductor layer 103. However, if the substrate 101 is conductive, it can also serve as the lower electrode. However, if the substrate 101 is conductive but has a high sheet resistance, the electrode 102 may be provided as a low-resistance electrode for current collecting, or for increasing the reflectance on the substrate surface, thereby achieving efficient utilization of the incident light.

The electrode can be formed by a metal such as Ag, Au, Pt, Ni, Cr, Cu, Al, Ti, Zn, Mo or W or an alloy thereof, and a thin film of such metal is formed by vacuum evaporation, electron beam evaporation or sputtering. It is preferred that the formed metal film does not constitute a resistance component to an output of the photovoltaic device.

Though not illustrated, a transparent conductive layer such as of conductive zinc oxide may be provided between the lower electrode 102 and the n-type semiconductor layer 103. Functionally, the transparent conductive layer can be considered a diffusion preventing layer. Such diffusion preventing layer not only prevents a diffusion of a metal element, constituting the lower electrode 102, into the n-type semiconductor layer, but is given a certain resistance to prevent shortcircuiting between the lower electrode 102 and the upper electrode 112 resulting from a defect such as a pinhole in a semiconductor layer therebetween, and serves to generate a multiple interference by a thin film thereby enclosing the incident light within the photovoltaic device.

(Upper Electrode (Transparent Electrode))

The transparent electrode 112 to be employed in the present invention preferably has a light transmittance of 85% or higher in order that the solar light or the light from a white fluorescent lamp can be efficiently absorbed in the semiconductor layer, and electrically has a sheet resistance preferably of 300 Ω/□ or less in order not to constitute a resistance component to the output of the photovoltaic device. Examples of a material having such properties includes an extremely thin semi-transparent film of a metal oxide such as $SnO_2$, $In_2O_3$, ZnO, CdO, $CdSnO_4$, ITO ($In_2O_3$+$Sn_2$), a metal such as Au, Al, Cu, etc.

As the transparent electrode 112 deposited on the p-type semiconductor layer 111 in FIG. 1, there are preferably selected materials with satisfactory mutual adhesion. These may be prepared by resistance-heated evaporation, electron beam-heated evaporation, sputtering, spraying, etc., which may be suitably selected according to the purpose.

(Current Collecting Electrode)

A current-collecting electrode to be employed in the present invention is provided on the transparent electrode 112 for the purpose of reducing the surface resistance of the transparent electrode 112. A material for the electrode can be a thin film of a metal such as Ag, Cr, Ni, Al, Au, Ti, Pt, Cu, Mo or W or an alloy thereof. A stack of these thin films may also be used in a laminate. Also a shape and an area of the film are suitably selected so as to secure a sufficient incident light amount into the semiconductor layer.

For example, the collecting electrode preferably has a shape uniformly spread in a light-receiving surface of the photovoltaic device, and its area preferably is 15% or less of a light-receiving area, more preferably 10% or less. Also it has a sheet resistance preferably of 50 $\Omega/\square$ or less, more preferably 10 $\Omega/\square$ or less.

(Semiconductor Layer)

Semiconductor layers 103, 104, 105, 106, 107, 108, 109, 110 and 111 are prepared by an ordinary thin film preparing process, and can be prepared by employing a known method such as evaporation, sputtering, high frequency plasma CVD, microwave plasma CVD, ECR, thermal CVD or LPCVD as desired. Industrially there is preferably employed a plasma CVD in which a raw material gas is decomposed by plasma and deposited on the substrate.

As a reaction apparatus, there can be employed a batch-type apparatus or a continuous film-forming apparatus as desired. A semiconductor with valence electron control can also be prepared by simultaneously decomposing $PH_3$ or $B_2H_6$ gas containing phosphor or boron as a constituent atom.

(I-Type Semiconductor Layer)

In the present photovoltaic device, as a semiconductor material for forming an advantageously employable i-type semiconductor layer, there can be employed so-called group IV alloy-based semiconductor materials such as a-SiGe:H, a-SiGe:F, or a-SiGe:H:F for producing an i-type layer of amorphous silicon germanium. Also, in the case of forming an i-type semiconductor layer other than amorphous silicon germanium in tandem cell structure formed by stacking unit devices, there can be employed so-called group IV and group VI alloy-based semiconductor materials such as a-Si:H, a-Si:F, a-Si:H:F, a-SiC:H, a-SiC:F, a-SiC:H:F, poly-Si:H, poly-Si:F, or poly-Si:H:F, and so-called compound semiconductor materials, such as those of groups III–V and II–VI.

A raw material gas employed in CVD as a silicon-containing compound can be a linear or cyclic silane, specifically a gaseous compound or an easily gasifiable compound such as $SiH_4$, $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $SiCl_6$, $SiHCl_3$, $SiHBr_2$, $SiH_2Cl_2$, or $SiCl_3F_3$.

Also, a germanium-containing compound can be a linear germane, a halogenated germanium, a cyclic germane, or an organic germanium compound having a halogenated germane, a linear or cyclic germanium compound, and an alkyl group, etc., more specifically $GeH_4$, $Ge_2H_6$, $Ge_3H_8$, n-$Ge_4H_{10}$, t-$Ge_4H_{10}$, $Ge_5H_{10}$, $GeH_3Cl$, $GeH_2F_2$, $Ge(CH_3)_4$, $Ge(C_2H_5)_4$, $Ge(C_6H_5)_4$, $Ge(CH_3)_2F_2$, $GeF_2$, or $GeF_4$.

(P-type Semiconductor Layer and N-type Semiconductor Layer)

A semiconductor material for constituting the p-type semiconductor layer or the n-type semiconductor layer advantageously employed in the present photovoltaic device can be obtained by doping an aforementioned semiconductor material for constituting the i-type semiconductor layer with a valence electron controlling agent. For forming such layer, there can be advantageously employed a method similar to the aforementioned method for forming the i-type semiconductor layer. As the raw material for forming a deposited layer containing an element of the group IV of the periodic table, for obtaining a p-type semiconductor, a compound containing an element of the group III of the periodic table is employed as a valence electron controlling agent. Such element of the group III can be B, and specific examples of the compound containing B include $BF_3$, $B_2H_6$, $B_4H_{10}$, $B_5H_9$, $B_5H_{11}$, $B_6H_{10}$, $B(CH_3)_3$, $B(C_2H_5)_3$, and $B_6H_{12}$.

Also for obtaining an n-type semiconductor, a compound containing an element of the group V of the periodic table is employed as a valence electron controlling agent. Such element of the group V can be P or N, and specific examples of the compound containing such element include $N_2$, $NH_3$, $N_2H_5N_3$, $N_2H_4$, $NH_4N_3$, $PH_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(SCN)_3$ and $P_2H_4$.

In the following, there will be given a detailed description on the control of an oxygen concentration and a carbon concentration in the vicinity of a p/n interface of the present invention.

In a photovoltaic device of a tandem cell formed by stacking a plurality of unit devices each having a pn or pin structure, at an interface of a p-type layer and an n-type layer between the unit devices, a delicate change or a structural strain in a matching or an impurity amount in the interface may cause an increase in the serial resistance and thereby a deterioration in the I-V characteristics, thus significantly affecting the performance of the photovoltaic device. Also such p/n interface may be seriously damaged by plasma at an initial discharge of film formation, thereby leading to a deterioration in the interfacial characteristics.

The present inventor, as a result of intensive investigations, has found that addition of a small amount of oxygen and/or carbon in the vicinity of the interface of the n-type layer and the p-type layer facilitates control of the interface, thus leading to an improvement in the characteristics, and thus accomplishing the present invention.

In the p-type layer and the n-type layer, there are respectively employed conventional impurity elements B and P as the valence electron controlling agents, but, additionally in the present invention, an oxygen atom concentration and/or a carbon atom concentration is so controlled as to have a maximum peak in the vicinity of the p/n interface between the unit devices.

The oxygen atom concentration can be controlled so as to have a peak in the vicinity of the p/n interface by controlling an introduction amount of a gas containing oxygen as a constituting element. In such an operation, the peak oxygen concentration is preferably controlled within a range from $1 \times 10^{18}$ to $1 \times 10^{22}$ atoms/cm$^3$.

The carbon atom concentration can be controlled so as to have a peak in the vicinity of the p/n interface by controlling an introduction amount of a gas containing carbon as a constituting element. In such an operation, the peak carbon concentration is preferably controlled within a range from $1 \times 10^{16}$ to $1 \times 10^{20}$ atoms/cm$^3$.

In the present invention, oxygen and carbon may be added in any other method, and the present invention is not restricted by such method of addition.

In the present invention, the "vicinity of the p/n interface" means a region within ±100 nm from the p/n interface, between the unit devices to the p-type layer side and the n-type layer side (namely, a region having a thickness of 200 nm in total). A peak concentration present within a range of ±10 nm is more preferred, as the effect of the present invention of improving the interfacial characteristics is further enhanced.

A distribution of the concentration can be a symmetrical distribution, having a peak at the position of the p/n interface (±0) and symmetrical to both sides, or a distribution having a peak in the p-type layer or in the n-type layer. A distribution having a peak of the concentration at a light entrance side of the interface is considered effective in improving the optical characteristics, while a distribution having a peak in an opposite side to the light entrance side is considered effective for preventing diffusion of the impurity element, preventing a damage by plasma and improving a film adhesion.

As explained in the foregoing, a particularly large effect can be obtained by having a peak oxygen concentration in the vicinity of the p/n interface and controlling such peak oxygen concentration within a range from $1 \times 10^{18}$ to $1 \times 10^{22}$ atoms/cm$^3$. Also a particularly large effect can be obtained by having a peak carbon concentration in the vicinity of the p/n interface and controlling such peak carbon concentration within a range from $1 \times 10^{16}$ to $1 \times 10^{20}$ atoms/cm$^3$.

Thus, by controlling the oxygen concentration and/or the carbon concentration under such conditions, it is possible to effectively prevent diffusion of conductive type determining impurities in the p-type semiconductor and the n-type semiconductor and to improve the interfacial characteristics. Also, the p- or n-conductive type determining impurity, if present in an excessively large amount, deteriorates the photoconductivity, thereby increasing the serial resistance. Addition of oxygen and/or carbon widens a control latitude for the amount of such impurity, and also improves the optical characteristics.

Furthermore, addition of oxygen and/or carbon allows a highly resistant interface to form, which is less susceptible to a damage by plasma. It also relaxes a structural strain in the interface, thus improving the matching at the interface, and the adhesion and stability of the films.

If the peak oxygen concentration is less than $1 \times 10^{18}$ atoms/cm$^3$ and/or if the peak carbon concentration is less than $1 \times 10^{16}$ atoms/cm$^3$, the effects of the present invention may not be exhibited sufficiently. On the other hand, if the peak oxygen concentration exceeds $1 \times 10^{22}$ atoms/cm$^3$ and/or the peak carbon concentration exceeds $1 \times 10^{20}$ atoms/cm$^3$, the interfacial structure may become unstable, and there may result detrimental effects on the electrical and optical characteristics.

In the following, there will be shown examples of the present invention, but the present invention is not limited by such examples.

EXAMPLE 1

Figure 6:
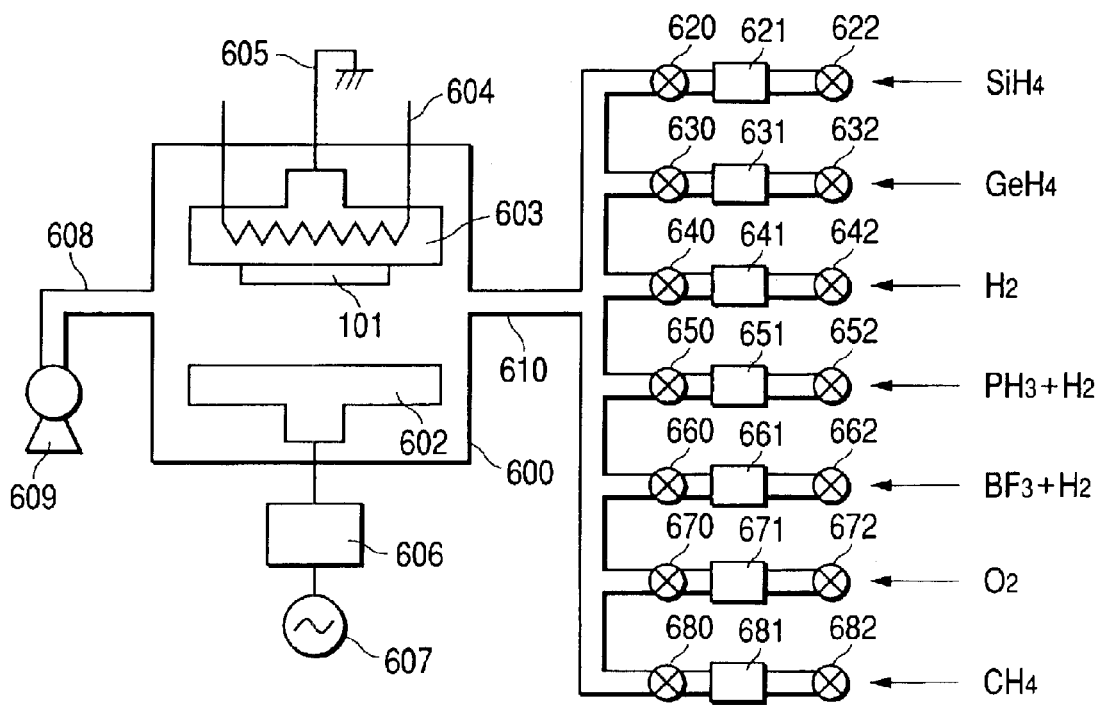
FIG. 6 is a schematic view showing a film-forming apparatus adapted for preparing the photovoltaic device of the present invention.

A solar cell of the present invention having triple cells as three unit devices was produced using a CVD film forming apparatus shown in FIG. 6. In FIG. 6, there are shown a reaction chamber 600, a substrate 101, an anode 602, a cathode 603, a substrate heater 604, a grounding terminal 605, a matching box 606, a RF power source 607, an exhaust pipe 608, a vacuum pump 609, a film-forming-gas introduction pipe 610, valves 620, 630, 640, 650, 660, 670, 680, 622, 632, 642, 652, 662, 672 and 682, and mass flow controllers 621, 631, 641, 651, 661, 671 and 681.

At first, a stainless steel (SUS 304) substrate 101 of a size of 5×5 cm with a surface mirror-polished to 0.05 μm Rmax was charged in an unrepresented sputtering apparatus. After the interior of the apparatus was evacuated to $10^{-5}$ Pa or less, Ar gas was introduced and set to an internal pressure of 0.6 Pa, and a sputtering was executed with an Ag target by generating a DC plasma discharge with a power of 200 W, thereby depositing Ag in a thickness of about 500 nm.

Then a sputtering was conducted by changing the target to ZnO but employing the same internal pressure and electric power, thereby depositing ZnO in a thickness of about 500 nm.

After the formation of a lower electrode 102 in the foregoing steps, the substrate 101 was taken out and was mounted on the cathode 603 in the reaction chamber 600, and the interior thereof was sufficiently evacuated by the vacuum pump 609 to a vacuum level of $10^{-4}$ Pa measured with an unrepresented ion gauge.

Then the substrate 101 was heated to 300° C. by the substrate heater 604. After the substrate temperature became constant, the valves 620 and 622 were opened and the mass flow controller 621 was so regulated as to introduce SiH$_4$ gas at a flow rate of 30 sccm, from an unrepresented SiH$_4$ container into the reaction chamber 600 through the gas introduction pipe 610.

In the foregoing, the unit "sccm" indicates a unit of flow rate, wherein 1 sccm=1 cm$^3$/min (in a normal state), and the flow rate is hereinafter represented in the unit of sccm.

Similarly the valves 640 and 642 were opened and the mass flow controller 641 was so regulated as to introduce H$_2$ gas at a flow rate of 300 sccm, and the valves 650 and 652 were opened and the mass flow controller 651 was so regulated as to introduce PH$_3$ gas diluted to 5% with H$_2$ gas at a flow rate of 10 sccm.

After the internal pressure of the reaction chamber 600 was regulated to 200 Pa, an electric power of 10 W was supplied from the RF power source 607 through the matching box 606, thereby generating a plasma discharge and depositing an n-type amorphous silicon layer 103 in a thickness of 40 nm.

After the termination of the gas supply, the interior of the reaction chamber 600 was again evacuated to a vacuum level of $10^{-4}$ Pa or lower, and the valves 620, 622, 630, 632, 640 and 642 were opened to introduce SiH$_4$ gas at a flow rate of 30 sccm, H$_2$ gas at a flow rate of 300 sccm and GeH$_4$ gas at a flow rate of 5.0 sccm into the reaction chamber 600. Then an electric power of 20 W was supplied from the RF power source 607, thereby generating a plasma discharge and depositing an i-type amorphous silicon germanium layer 104 in a thickness of about 180 nm.

Then, by setting the mass flow controllers at a flow rate of 0 sccm and closing the valves 620, 622, 630, 632, 640 and 642, the flow rates of SiH$_4$, H$_2$ and GeH$_4$ gases were instantaneously shut down to 0 sccm. Also the RF power was turned off to 0 W to terminate the plasma discharge after the termination of the gas supply, the interior of the reaction chamber 600 was evacuated to a vacuum level of $10^{-4}$ or less, and the valves 620, 622, 640, 642, 660 and 662 were opened to introduce SiH$_4$ gas at a flow rate of 1 sccm, H$_2$ gas at a flow rate of 300 sccm and BF$_3$ gas diluted to 5% with H$_2$ gas at a flow rate of 10 sccm into the reaction chamber 600.

Then an electric power of 20 W was supplied from the RF power source 607, thereby generating a plasma discharge to deposit a p-type layer 105 in a thickness of 10 nm, thereby obtaining a bottom layer 114. This p-type layer was confirmed to be constituted by microcrystals of a grain size of 2 to 10 nm, by a sample prepared on a glass substrate under the same conditions in a cross-sectional observation under a transmission electron microscope (TEM).

Then an n-type layer 106 was deposited in the same manner as in the formation of the aforementioned n-type 103, and an i-type layer 107 was deposited with a thickness of 100 nm, in the same manner as in the formation of the aforementioned i-type layer 104 except that the flow rate of GeH$_4$ gas was changed to 2.5 sccm.

Then a p-type layer 108 was deposited in the same manner as in the formation of the aforementioned p-type layer 105, but, in the course of film deposition, the valves 670 and 672 were opened and O$_2$ gas was introduced under such control of the mass flow controller 671 that the oxygen concentration gradually increased toward an interface with an n-type layer 109 to be formed next, thereby completing a middle layer 115.

Then, at the deposition of an n-type layer 109, O$_2$ gas was introduced by opening the valves 670 and 672 and regulating the mass flow controller 671. The flow rate of O$_2$ gas was so controlled that the oxygen concentration became continuous with that in the middle p-type layer 108, and had a peak in the vicinity of the interface and gradually decreased thereafter.

Then, SiH$_4$ gas at a flow rate of 30 sccm and H$_2$ gas at a flow rate of 300 sccm were introduced, and an electric power of 20 W was applied to deposit an i-type amorphous silicon layer 110 in a thickness of 70 nm, and a p-type layer 111 was deposited to complete a top layer 116.

Then, after cooling, the substrate bearing the formed semiconductor layers was taken out from the reaction chamber 600 and placed in an unrepresented resistance-heated evaporation apparatus. After the interior of the apparatus was evacuated to $10^{-5}$ Pa or less, oxygen gas was introduced and set to an internal pressure of 50 Pa, and an In—Sn alloy was evaporated by resistance heating, thereby depositing a transparent conductive film (ITO film (indium tin oxide film)) serving as an upper electrode 112 and also having an antireflective function.

After the evaporation, the substrate was taken out, then separated into sub cells of a size of 1 cm×1 cm in an unrepresented dry etching apparatus, and in another evaporation apparatus, an aluminum collecting electrode 113 was formed thereon by electron beam evaporation. A solar cell thus obtained is indicated as Sample No. 1-1.

Also, Samples Nos. 1-2, 1-3, 1-4 and 1-5 were produced in the same manner as explained in the foregoing, except that the O$_2$ gas flow rate was changed in the middle p-type layer 108 and in the top n-type layer 109.

Figure 2:
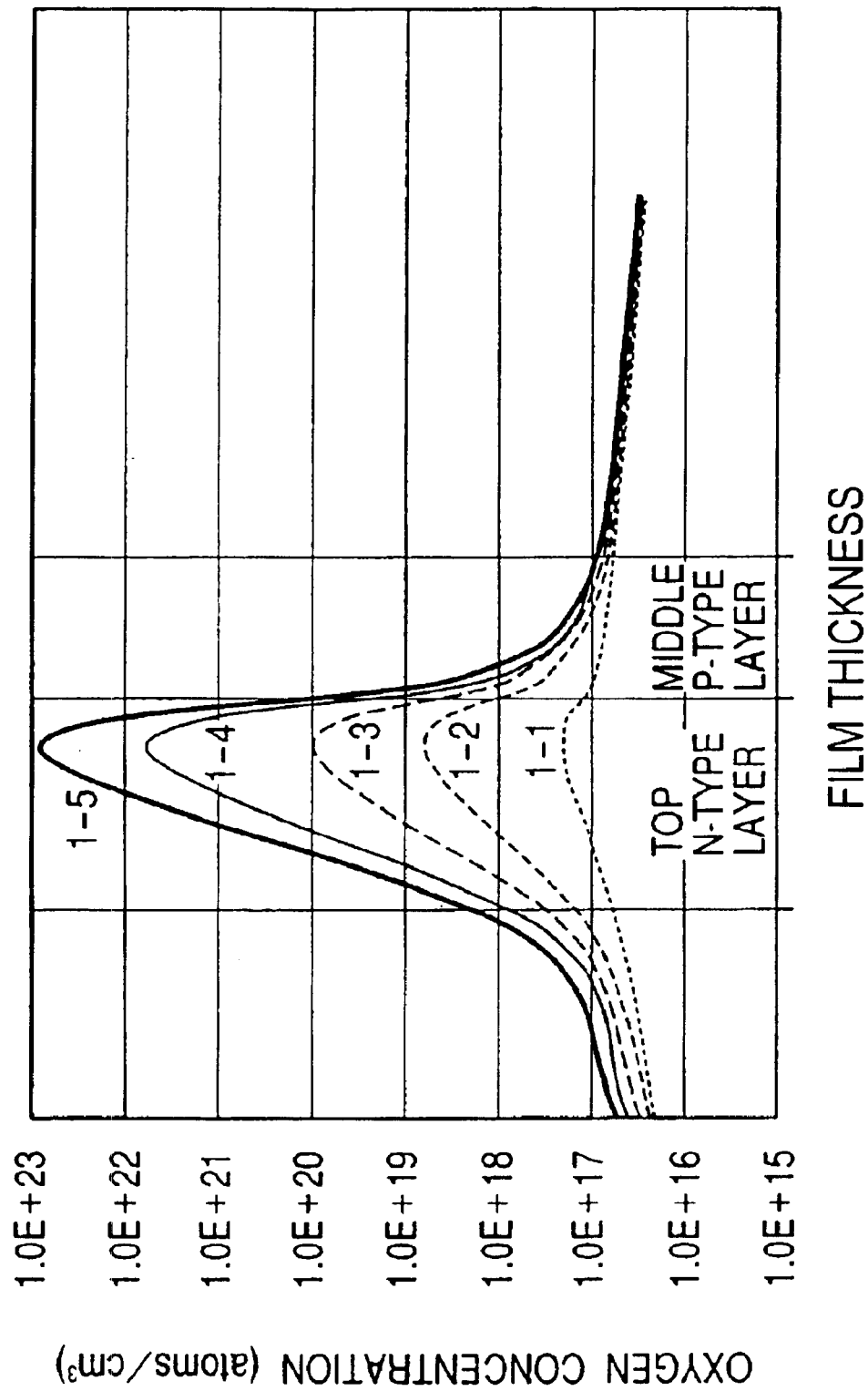
FIG. 2 is a graph showing an oxygen concentration distribution in the film thickness direction of a triple cell prepared in Examples.

FIG. 2 shows a distribution of oxygen concentration in the film thickness direction of these samples, particularly in the vicinity of the interface between the top n-type layer and the middle p-type layer. A SIMS measurement was used for determining the oxygen concentration, and confirmed that the oxygen atom concentration had a peak value at a side of the top n-type layer in the vicinity of the n/p interface.

Also each sample was irradiated in a solar simulator with a light of solar spectrum of AM-1.5, with an intensity of 100 mW/cm$^2$, to obtain a voltage-current curve thereby determining an initial conversion efficiency of the solar cell. Obtained results are shown in FIG. 3.

Figure 3:
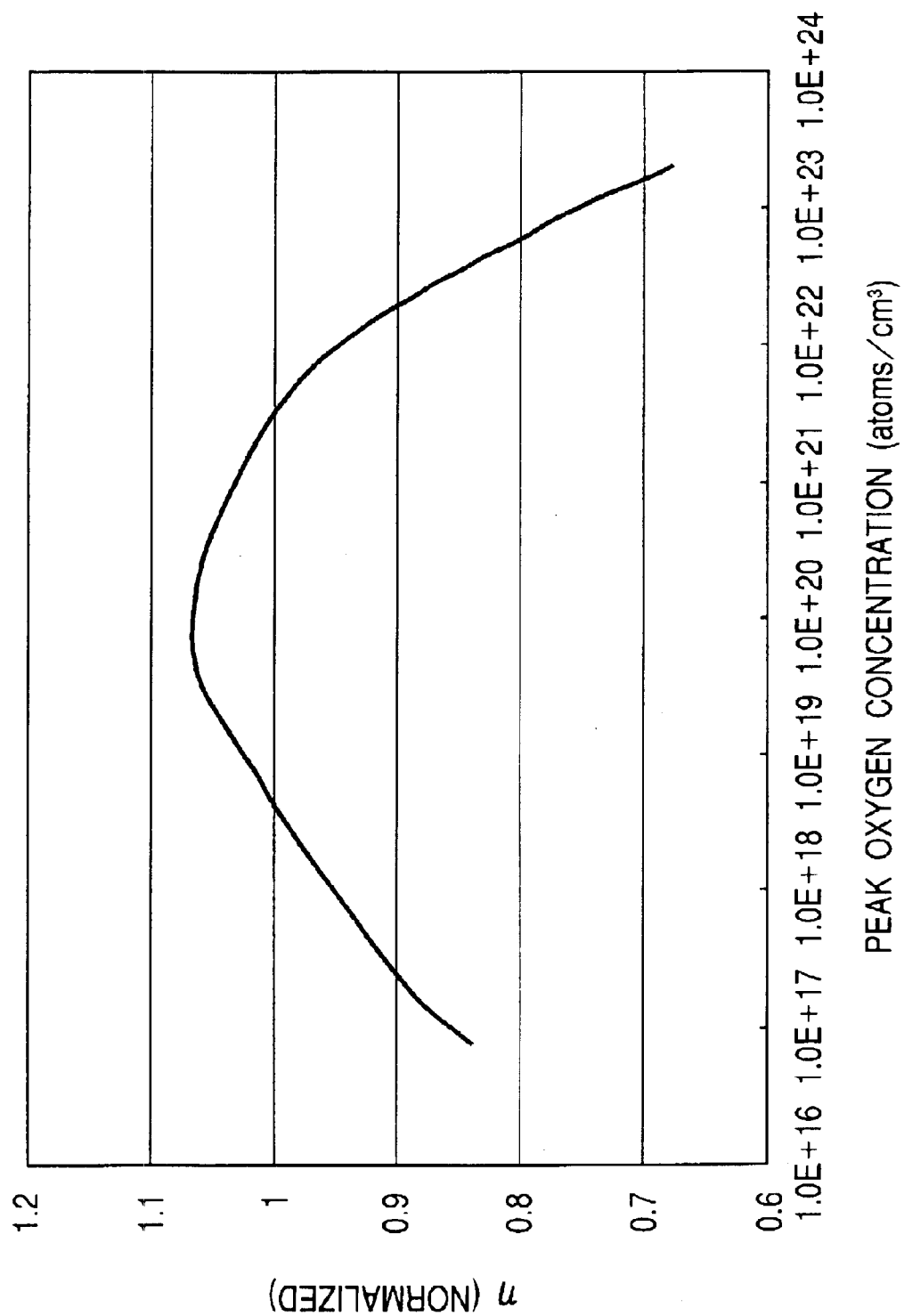
FIG. 3 is a graph showing a relationship between a peak oxygen concentration in a top n-type layer and an initial conversion efficiency, in a triple cell prepared in Examples.

FIG. 3 shows an initial conversion efficiency η as a function of a peak oxygen concentration in the top n-type layer in each sample, in the abscissa. The initial conversion efficiency η is represented in a normalized value, taking the initial conversion efficiency of the sample 1-2 as 1.

A lower limit of the initial conversion efficiency, preferred for the practical performance and the reliability of the solar cell, is defined as 0.95 in the above-described normalized value. It will be seen that an initial conversion efficiency equal to or higher than such lower limit can be obtained under the condition that a peak oxygen concentration in the vicinity of the p/n interface is within a range from $1\times10^{18}$ to $1\times10^{22}$ atoms/cm$^3$.

EXAMPLE 2

The film-forming apparatus shown in FIG. 6 was used to produce a triple cell in the same manner as in Example 1, except that O$_2$ gas used for forming the middle p-type layer and the top n-type layer was changed to CH$_4$ gas. More specifically, CH$_4$ gas was supplied by opening the valves 680 and 682 and regulating the mass flow controller 681, and Samples Nos. 2-1, 2-2, 2-3, 2-4 and 2-5 were produced by varying the flow rate.

Figure 4:
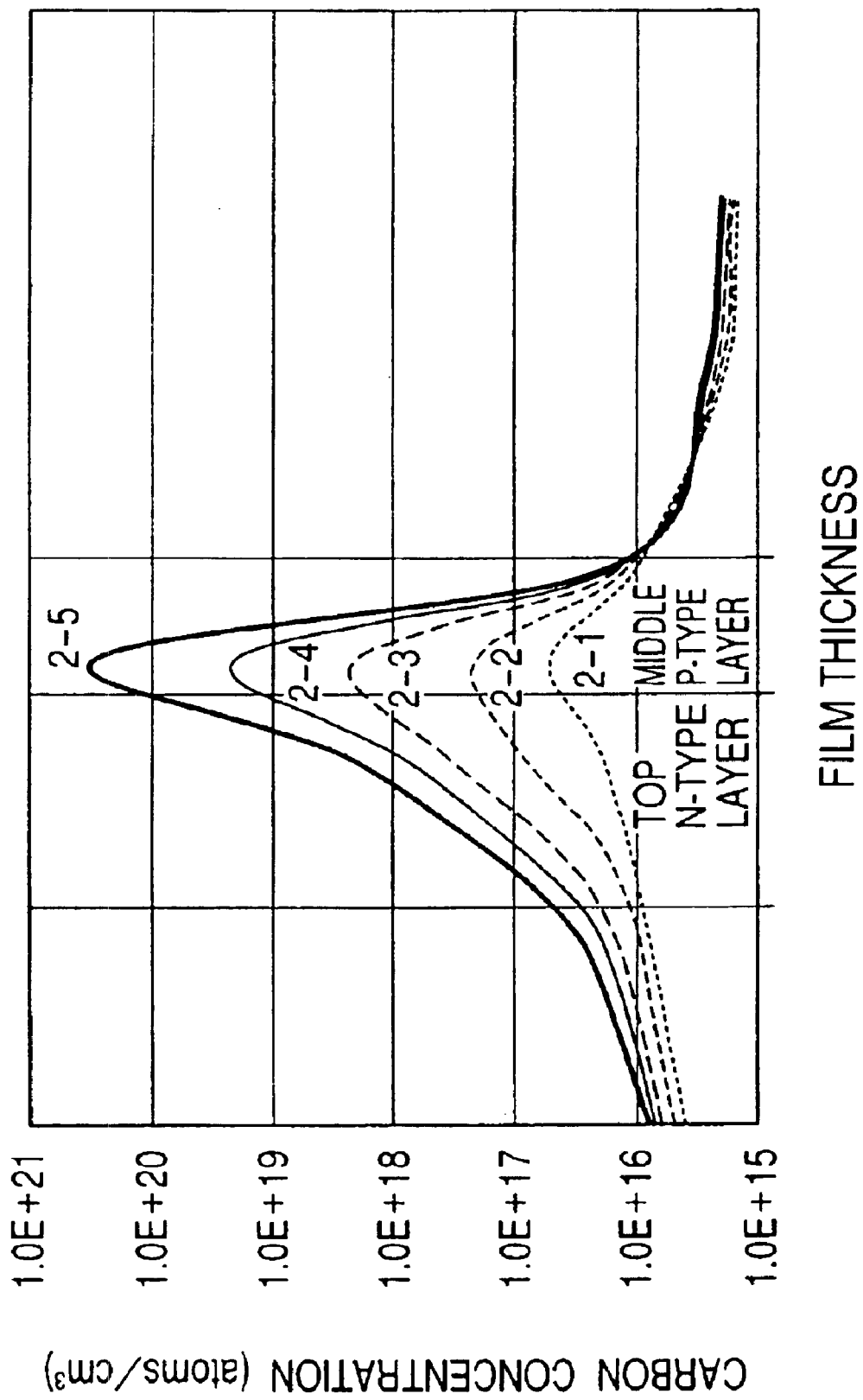
FIG. 4 is a graph showing a carbon concentration distribution in the film thickness direction of a triple cell prepared in Examples.

FIG. 4 shows a distribution of carbon concentration in the film thickness direction of these samples, particularly in the vicinity of the interface between the top n-type layer and the middle p-type layer. A SIMS measurement was used for determining the carbon concentration, and confirmed that the carbon atom concentration had a peak value at a side of the middle p-type layer in the vicinity of the p/n interface.

Figure 5:
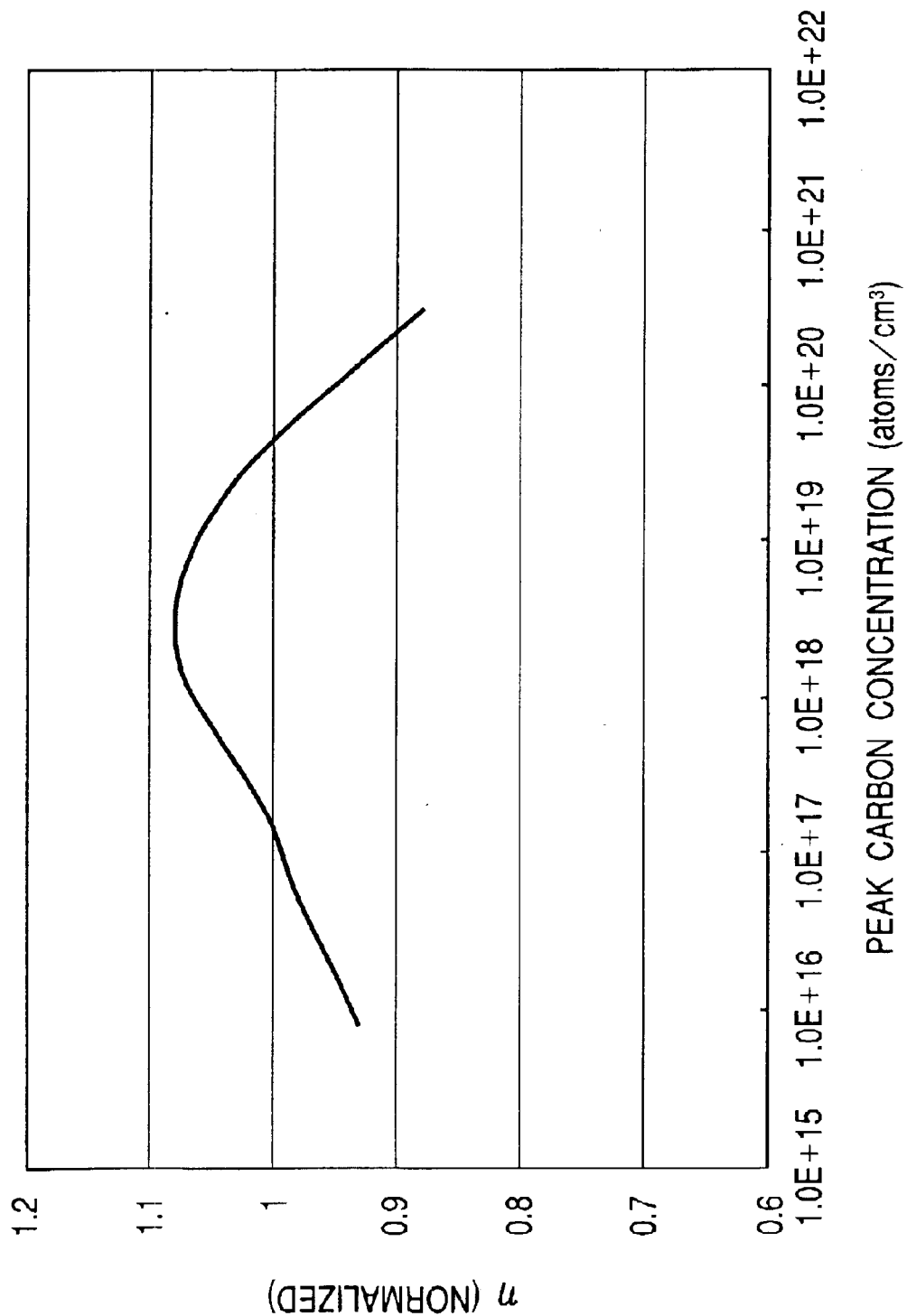
FIG. 5 is a graph showing a relationship between a peak carbon concentration in a middle p-type layer and an initial conversion efficiency, in a triple cell prepared in Examples.

Also, each sample was subjected to a measurement of an initial conversion efficiency as in Example 1, and the results obtained are shown in FIG. 5.

FIG. 5 shows an initial conversion efficiency η as a function of a peak carbon concentration in the middle p-type layer in each sample, in the abscissa. The initial conversion efficiency η is represented in a normalized value, taking the initial conversion efficiency of Sample No. 2-2 as 1.

As in Example 1, a lower limit of the initial conversion efficiency, preferred for the practical performance and the reliability of the solar cell, is defined as 0.95 in the above-described normalized value. It will be seen that an initial conversion efficiency equal to or higher than such lower limit can be obtained under the condition that a peak carbon concentration in the vicinity of the p/n interface is within a range from $1\times10^{16}$ to $1\times10^{20}$ atoms/cm$^3$.

EXAMPLE 3

The film-forming apparatus shown in FIG. 6 was used to produce a triple cell in the same manner as in Example 1. In this example, however, O$_2$ gas and CH$_4$ gas were simultaneously supplied for the middle p-type layer and the top n-type layer. More specifically, O$_2$ gas and CH$_4$ gas were supplied by opening the valves 670, 672, 680 and 682 and regulating the mass flow controllers 671 and 681, and samples were produced by varying the flow rate. In this operation, the samples were produced in such a manner that the peak oxygen concentration and the peak carbon concentration were present at the side of the middle p-type layer in the vicinity of the p/n interface, and there was investigated the relationship between the peak oxygen concentration, the peak carbon concentration and the initial conversion efficiency as in Examples 1 and 2. As a result, there were obtained results similar to those in Examples 1 and 2, and it was confirmed that optimum values for the peak oxygen concentration and the peak carbon concentration in the vicinity of the p/n interface were the same as those in Examples 1 and 2.

EXAMPLE 4

The film-forming apparatus shown in FIG. 6 was used to produce a triple cell in the same manner as in Example 1. In the present example, however, samples were produced in such a manner that the peak oxygen concentration was present at the side of the middle p-type layer in the vicinity of the interface between the middle p-type layer and the top n-type layer, and the relationship between the peak oxygen concentration and the initial conversion efficiency with changing the oxygen concentration was investigated as in Example 1. As a result, there were obtained results similar to those in Example 1, and it was confirmed that an optimum value for the peak oxygen concentration in the vicinity of the p/n interface was similar to that in Example 1.

As explained in the foregoing, preferred examples of the present invention provide the following effects.

Production of a photovoltaic device under the aforementioned conditions effectively prevents diffusion of conductive type determining impurities in the p-type semiconductor and/or the n-type semiconductor, and improves the interfacial characteristics. Also, even if the p- or n-conductive type determining impurity is present in an excessive amount, though it deteriorates the photoconductive rate thereby increasing the serial resistance, addition of oxygen and/or carbon widens a control latitude for the amount of such impurity and also improves the optical characteristics.

Furthermore, addition of oxygen and/or carbon forms a highly resistant interface, which is less susceptible to a damage by plasma. It also relaxes a structural strain in the interface, thus improving the matching at the interface, and the adhesion and stability of the films.

Such improvement in the interfacial characteristics provides a photovoltaic device of a high photoelectric conversion efficiency, and further a photovoltaic device showing an excellent interfacial matching and a high structural stability (film adhesion).

What is claimed is:

1. A photovoltaic device comprising a plurality of unit devices stacked, each unit device comprising a silicon-based non-single-crystal semiconductor material and having a pn or pin structure, wherein an oxygen atom concentration has a maximum peak in a region within 10 nm from a p/n interface between the plurality of unit devices.

2. A photovoltaic device according to claim 1, wherein a concentration at the peak of the oxygen atom concentration is at least $1\times10^{18}$ atoms/cm$^3$ and at most $1\times10^{22}$ atoms/cm$^3$.

3. A photovoltaic device comprising a plurality of unit devices stacked, each unit device comprising a silicon-based non-single-crystal semiconductor material and having a pn or pin structure, wherein a carbon atom concentration has a maximum peak in a region within 10 nm from a p/n interface between the plurality of unit devices.

4. A photovoltaic device according to claim 3, wherein a concentration at the peak of the carbon atom concentration is at least $1\times10^{16}$ atoms/cm$^3$ and at most $1\times10^{20}$ atoms/cm$^3$.

5. A photovoltaic device comprising a plurality of unit devices stacked, each unit device comprising a silicon-based non-single-crystal semiconductor material and having a pn or pin structure, wherein an oxygen atom concentration and a carbon atom concentration have maximum peaks in a region within 10 nm from a p/n interface between the plurality of unit devices.

6. A photovoltaic device according to claim 5, wherein a concentration at the peak of the oxygen atom concentration is at least $1\times10^{18}$ atoms/cm$^3$ and at most $1\times10^{22}$ atoms/cm$^3$, and a concentration at the peak of the carbon atom concentration is at least $1\times10^{16}$ atoms/cm$^3$ and at most $1\times10^{20}$ atoms/cm$^3$.

* * * * *

UNITED STATES PATENT AND TRADEMARK OFFICE
CERTIFICATE OF CORRECTION

PATENT NO. : 6,911,594 B2
DATED : June 28, 2005
INVENTOR(S) : Atsushi Yasuno

It is certified that error appears in the above-identified patent and that said Letters Patent is hereby corrected as shown below:

<u>Title page,</u>
Item [56], References Cited, OTHER PUBLICATIONS, "Guha, et al." reference, "Letters,49, (49)," should read -- Letters, 49, (4) --.

<u>Column 2,</u>
Line 12, "preferably "$1x10^{18}$"" should read -- preferably $1x10^{18}$ --.
Line 13, "lower"." should read -- lower. --.
Line 22, "preferably "$10^{16}$"" should read -- preferably $1x10^{16}$ --.
Line 23, "$10^{20}$ atoms/cm$^3$ or lower"." should read -- $1x10^{20}$ atoms/cm$^3$ or lower. --.
Line 36, should read -- $1x10^{16}$ atoms/cm$^3$ or higher and $1x10^{20}$ atoms/cm$^3$ or lower. --.

<u>Column 3,</u>
Line 53, "of" should be deleted.

<u>Column 4,</u>
Line 63, "includes" should read -- include --.

<u>Column 7,</u>
Line 18, "a" (1$^{st}$ occurrence) should be deleted.

<u>Column 11,</u>
Line 29, "a" should be deleted.

Signed and Sealed this

First Day of November, 2005

JON W. DUDAS
*Director of the United States Patent and Trademark Office*